(12) United States Patent
Heller

(10) Patent No.: US 11,385,322 B2
(45) Date of Patent: Jul. 12, 2022

(54) SWITCHABLE FMCW/PMCW RADAR TRANSCEIVER

(71) Applicant: Ay Dee Kay LLC, Aliso Viejo, CA (US)

(72) Inventor: Tom Heller, Karmiel (IL)

(73) Assignee: Ay Dee Kay LLC, Aliso Viejo, CA (US)

( * ) Notice: Subject to any disclaimer, the term of this patent is extended or adjusted under 35 U.S.C. 154(b) by 367 days.

(21) Appl. No.: 16/455,469

(22) Filed: Jun. 27, 2019

(65) Prior Publication Data

US 2020/0341108 A1    Oct. 29, 2020

Related U.S. Application Data

(60) Provisional application No. 62/839,927, filed on Apr. 29, 2019.

(51) Int. Cl.
| | | |
|---|---|---|
| *G01S 7/02* | (2006.01) | |
| *G01S 13/36* | (2006.01) | |
| *G01S 13/34* | (2006.01) | |
| *G01S 7/40* | (2006.01) | |

(52) U.S. Cl.
CPC ............ *G01S 7/023* (2013.01); *G01S 7/0233* (2021.05); *G01S 7/0234* (2021.05);
(Continued)

(58) Field of Classification Search
CPC .... G01S 13/931; G01S 7/4056; G01S 7/4004; G01S 7/4069; G01S 7/40; G01S 7/4017;
(Continued)

(56) References Cited

U.S. PATENT DOCUMENTS

| | | | | |
|---|---|---|---|---|
| 9,331,797 B2 * | 5/2016 | Kordik | .................. | H04L 7/0054 |
| 9,791,564 B1 * | 10/2017 | Harris | .................. | G01S 13/931 |

(Continued)

FOREIGN PATENT DOCUMENTS

| | | | | | |
|---|---|---|---|---|---|
| EP | 2755044 A1 * | 7/2014 | | ........... | G01S 13/931 |
| EP | 2773044 A1 * | 9/2014 | | ........... | G01S 7/4056 |
| EP | 3343243 A1 * | 7/2018 | | ........... | G01S 7/4056 |

OTHER PUBLICATIONS

A. Bourdoux, et al., "Phenomenology of Mutual Interference of FMCW and PMCW Automotive Radars," 2017 IEEE Radar Conference (RadarConf), pp. 1709-1714.
(Continued)

*Primary Examiner* — Olumide Ajibade Akonai
(74) *Attorney, Agent, or Firm* — Steven Stupp

(57) ABSTRACT

Automotive radar methods and systems for enhancing resistance to interference using a built-in self-test (BIST) module. In one illustrative embodiment, an automotive radar transceiver includes: a signal generator that generates a transmit signal; a modulator that derives a modulated signal from the transmit signal using at least one of phase and amplitude modulation; at least one receiver that mixes the transmit signal with a receive signal to produce a down-converted signal, the receive signal including the modulated signal during a built-in self-test (BIST) mode of operation; and at least one transmitter that drives a radar antenna with a selectable one of the transmit signal and the modulated signal.

3 Claims, 3 Drawing Sheets

(52) U.S. Cl.
CPC .............. *G01S 7/0235* (2021.05); *G01S 7/40* (2013.01); *G01S 13/34* (2013.01); *G01S 13/36* (2013.01)

(58) Field of Classification Search
CPC .... G01S 7/4091; G01S 7/4008; G01S 7/4021; G01S 7/38; G01S 7/023; G01S 7/0233; G01S 7/352; G01S 7/006; G01S 13/288; H04B 17/21; H04B 17/0085; H04B 17/19; H04B 17/29; H04B 17/14; G06F 11/27; G06F 11/2284
USPC .................................. 342/173, 174; 714/733
See application file for complete search history.

(56) References Cited

U.S. PATENT DOCUMENTS

| | | | |
|---|---|---|---|
| 10,097,287 B1 * | 10/2018 | Schat | G06F 11/2284 |
| 10,324,165 B2 * | 6/2019 | Bordes | G01S 13/325 |
| 10,673,544 B2 * | 6/2020 | Christoffers | H04B 17/0085 |
| 10,761,186 B2 * | 9/2020 | Schrattenecker | G01S 7/032 |
| 2014/0266865 A1 * | 9/2014 | Doyle | G01S 7/354 342/174 |
| 2015/0276919 A1 | 10/2015 | Matsumura | |
| 2019/0242973 A1 * | 8/2019 | Schat | G01S 7/354 |
| 2019/0271776 A1 * | 9/2019 | Davis | G01S 7/023 |
| 2019/0391247 A1 * | 12/2019 | Gulati | G01S 13/343 |

OTHER PUBLICATIONS

Danny Elad et al., "Reconfigurable MIMO Radar," U.S. Appl. No. 16/203,149, filed Nov. 28, 2018, 21 pages.
Tom Heller, "Amplifiers Suitable for MM-Wave Signal Splitting and Combining," U.S. Appl. No. 16/453,033, filed Jun. 26, 2018, 25 pages.

* cited by examiner

SWITCHABLE FMCW/PMCW RADAR TRANSCEIVER

CROSS-REFERENCE TO RELATED APPLICATIONS

This application claims the benefit of U.S. Provisional Patent Application No. 62/839,927, filed on Apr. 29 2019, the entire contents of which is incorporated herein by reference.

BACKGROUND

In the quest for ever-safer and more convenient transportation options, many car manufacturers are developing self-driving cars which require an impressive number and variety of sensors, often including arrays of acoustic and/or electromagnetic sensors to monitor the distance between the car and any nearby persons, pets, vehicles, or obstacles. As the numbers of vehicles employing such sensors increases, so too does the potential for these vehicles to cause interference with each other's measurements. Existing sensor systems fail to adequately address the risks of such interference.

SUMMARY

Accordingly, there are disclosed herein automotive radar methods and systems for enhancing resistance to interference using a built-in self-test (BIST) module. In one illustrative embodiment, an automotive radar transceiver includes: a signal generator that generates a transmit signal; at least one modulator that derives a modulated signal from the transmit signal using at least one of phase and amplitude modulation; at least one receiver that mixes the transmit signal with a receive signal to produce a down-converted signal, the receive signal including the modulated signal during a built-in self-test (BIST) mode of operation; and at least one transmitter that drives a radar antenna with either the original transmit signal or the modulated transmit signal.

In an illustrative embodiment of a method for manufacturing a radar transceiver, the method includes: providing a signal generator to generate a transmit signal; coupling the transmit signal to a modulator to derive a modulated signal using at least one of phase and amplitude modulation; coupling the transmit signal to a mixer in a receiver to down-convert a receive signal; implementing a built-in self-test (BIST) mode of operation by selectably injecting the modulated signal into the receive signal; and providing transmission flexibility with a switch that selectably couples one of the transmit signal and the modulated signal to a transmitter.

In an illustrative embodiment of a method for operating a radar transceiver, the method includes: generating a transmit signal, the transmit signal being coupled to a mixer in a receiver to down-convert a receive signal; modulating the transmit signal using phase modulation to produce a modulated signal; injecting the modulated signal into the receive signal during a built-in self-test (BIST); verifying operation of the receiver during the built-in self-test; and selecting a frequency modulation or phase modulation transmission mode.

Each of the foregoing embodiments may be employed individually or conjointly, and they may further employ one or more of the following optional features in any suitable combination: 1. the down-converted signal is coupled to a measurement controller that derives a reflector distance and velocity from the down-converted signal. 2. the measurement controller provides a digital baseband signal that the modulator applies to the transmit signal using said at least one of phase and amplitude modulation. 3. the modulator is a phase modulator. 4. the signal generator frequency modulates the transmit signal to provide a chirp waveform. 5. the frequency modulation is selectably disabled during transmission of the modulated signal. 6. the receiver is one of multiple receivers that each mix the transmit signal with a respective receive signal to produce a respective down-converted signal. 7. the transmitter is one of multiple transmitters that each drive a respective radar antenna with a respective copy of the transmit signal or the modulated signal. 8. The transmitter is one of multiple transmitters where each includes a separate modulator. 9. coupling a digital baseband signal from the measurement controller to the modulator to modulate the transmit signal. 10. said selecting includes: transmitting the transmit signal, the transmit signal including a chirp waveform; processing the down-converted receive signal to determine a distance to a reflector and relative velocity; if the down-converted receive signal is indicative of interference, selecting the phase modulation transmission mode; and if the down-converted receive signal is not indicative of interference, selecting the frequency modulation transmission mode. 11. transmitting the transmit signal in the frequency modulation transmission mode, the transmit signal including a chirp waveform. 12. transmitting the modulated signal in the phase modulation transmission mode.

DETAILED DESCRIPTION

It should be understood that the accompanying drawings and following detailed description do not limit the disclosure, but on the contrary, they provide the foundation for understanding all modifications, equivalents, and alternatives falling within the scope of the appended claims. Specific configurations, parameter values, and operation examples are provided for the purposes of explanation rather than for circumscribing any scope of disclosure.

Figure 1:
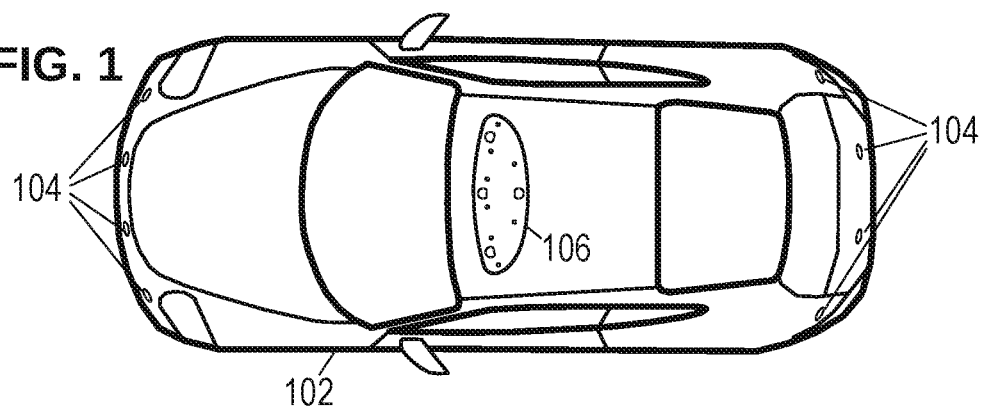
FIG. 1 is an overhead view of an illustrative vehicle equipped with sensors.

FIG. 1 shows an illustrative vehicle 102 equipped with a set of ultrasonic parking-assist sensors 104 and a multiple-input multiple-output (MIMO) radar antenna array 106. The type, number, and configuration of sensors in the sensor arrangement for vehicles having driver-assist and self-driving features varies. For example, at least some contemplated MIMO radar arrays for autonomous vehicles include four transmit antennas and eight or more receive antennas arranged to scan ahead of, around, and behind the vehicle. The vehicle may employ the sensor arrangement for detecting and measuring distances/directions to objects in the various detection zones to enable the vehicle to navigate while avoiding other vehicles and obstacles.

Figure 2:
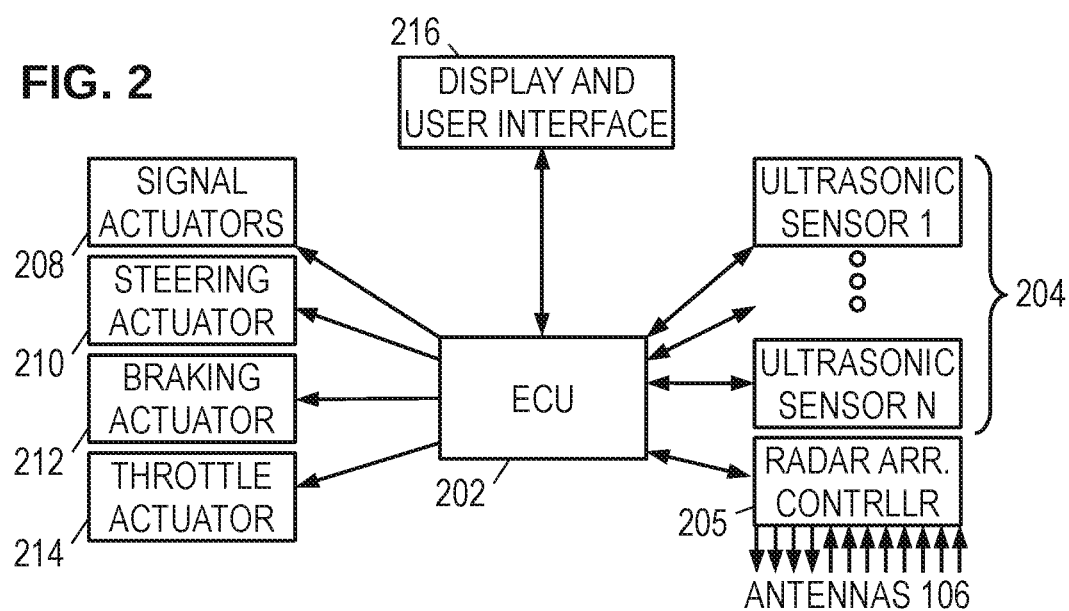
FIG. 2 is a block diagram of an illustrative driver-assistance system.

FIG. 2 shows an electronic control unit (ECU) 202 coupled to the various ultrasonic sensors 204 and a radar array controller 205 as the center of a star topology. Of course, other topologies including serial, parallel, and hierarchical (tree) topologies, are also suitable and contemplated for use in accordance with the principles disclosed herein. The radar array controller 205 couples to the transmit and receive antennas in the radar antenna array 106 to transmit electromagnetic waves, receive reflections, and determine a spatial relationship of the vehicle to its surroundings. To provide automated parking assistance, the ECU 202 may further connect to a set of actuators such as a turn-signal actuator 208, a steering actuator 210, a braking actuator 212, and throttle actuator 214. ECU 202 may further couple to a user-interactive interface 216 to accept user input and provide a display of the various measurements and system status.

Using the interface, sensors, and actuators, ECU 202 may provide automated parking, assisted parking, lane-change assistance, obstacle and blind-spot detection, autonomous driving, and other desirable features. In an automobile, the various sensor measurements are acquired by one or more electronic control units (ECU), and may be used by the ECU to determine the automobile's status. The ECU may further act on the status and incoming information to actuate various signaling and control transducers to adjust and maintain the automobile's operation. Among the operations that may be provided by the ECU are various driver-assist features including automatic parking, lane following, automatic braking, and self-driving.

To gather the necessary measurements, the ECU may employ a MIMO radar system. Radar systems operate by emitting electromagnetic waves which travel outward from the transmit antenna before being reflected back to a receive antenna. The reflector can be any moderately reflective object in the path of the emitted electromagnetic waves. By measuring the travel time of the electromagnetic waves from the transmit antenna to the reflector and back to the receive antenna, the radar system can determine the distance to the reflector and its velocity relative to the vehicle. If multiple transmit or receive antennas are used, or if multiple measurements are made at different positions, the radar system can determine the direction to the reflector and hence track the location of the reflector relative to the vehicle. With more sophisticated processing, multiple reflectors can be tracked. At least some radar systems employ array processing to "scan" a directional beam of electromagnetic waves and construct an image of the vehicle's surroundings. Both pulsed and continuous-wave implementations of radar systems can be implemented.

Figure 3:
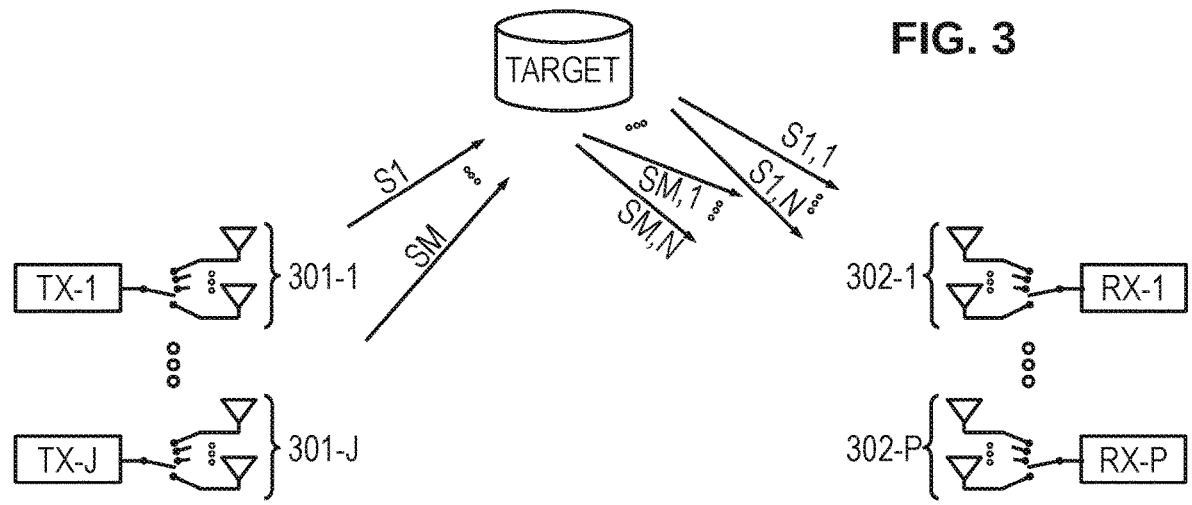
FIG. 3 is a schematic of an illustrative reconfigurable MIMO radar system.

FIG. 3 shows an illustrative system having a MIMO configuration, in which J transmitters are collectively coupled to M transmit antennas to send transmit signals. The M possible signals may variously reflect from one or more targets to be received via N receive antennas coupled to P receivers. Each receiver may extract the amplitude and phase or travel delay associated with each of the M transmit signals, thereby enabling the system to obtain N*M measurements (though only J*P of the measurements may be obtained concurrently). The processing requirements associated with each receiver extracting J measurements can be reduced via the use of time division multiplexing and/or orthogonal coding. The available antennas are systematically multiplexed to the available transmitters and receivers to collect the full set of measurements for radar imaging.

Figure 4A:
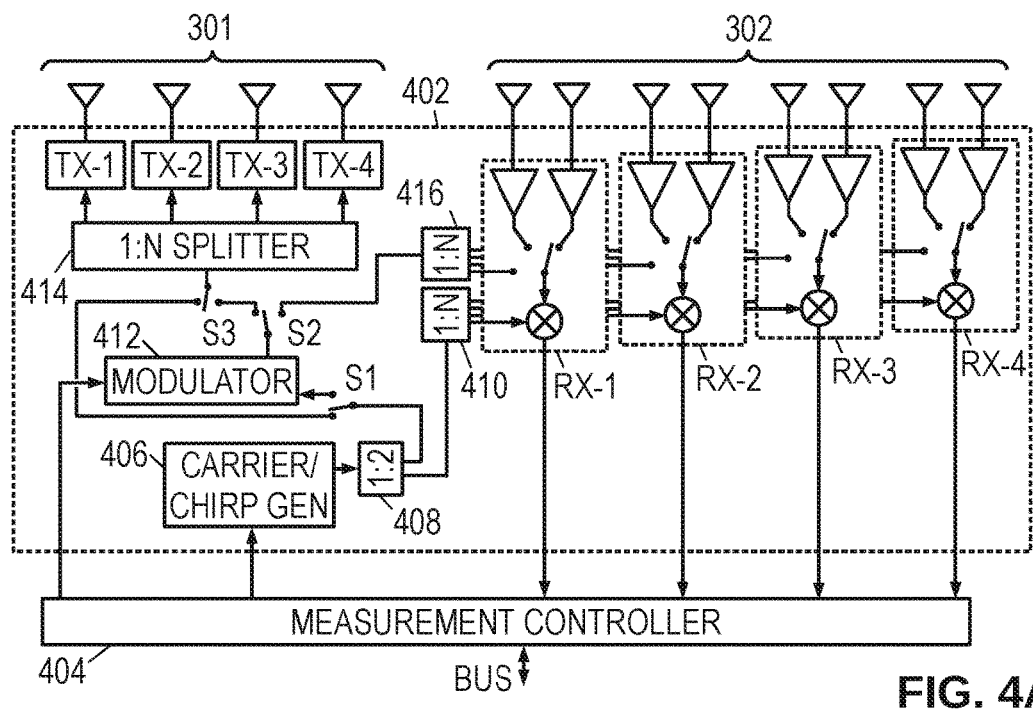
FIG. 4A is a block diagram of a first illustrative MIMO radar transceiver.

FIG. 4A shows an illustrative radar transceiver 402 which may be implemented as an integrated circuit in a packaged chip. The illustrated transceiver 402 includes four transmitters TX-1 through TX-4, each connected to a respective transmit antenna in transmit antenna array 301. The illustrated transceiver 402 further includes four receivers RX-1 through RX-4, each connected to two receive antennas in receive antenna array 302. Each receiver includes low noise amplifiers (LNAs) to amplify the signal from the antenna, a switch to select between the antenna signals (and a test signal), and a mixer to downconvert the selected signal to baseband. Alternative embodiments may further include intermediate frequency (IF) buffers, filters, amplifiers, etc., as well as mixer-first receivers, in accordance with known receiver designs.

A measurement controller 404 receives the downconverted signals from the receivers and processes them to derive measurements such as distance to the signal reflectors, direction of the reflectors, and relative velocity of the reflectors. The controller 404 may store the measurements in internal registers and communicate the measurements via a communications bus to the ECU. In at least some contemplated embodiments, the controller 404 is a digital signal processor (DSP) chip external to the transceiver 402, but some embodiments may integrate the controller onto the transceiver chip.

The controller 404 further supplies parameter values (e.g., frequency band, chirp rate) to a carrier signal generator 406 to control the transmitted radar waveform. The choice of the radar waveform has a significant impact on parameters such as range and velocity resolution, spectral efficiency, and sensitivity to interference. Frequency-Modulated Continuous Wave (FMCW) signals employ chirp waveforms (i.e., frequency-sweeps) to increase bandwidth and thereby achieve high range resolution. However, other waveforms such as Phase-Modulated Continuous-wave (PMCW) signals, can provide true MIMO without time division, and are less likely to sense interference from other radars, particularly when the source of the interference is an FMCW waveform.

Signal generator 406 includes a chirp generator to create an FMCW signal. The chip rate may be controlled and optionally disabled to provide an unmodulated carrier signal. The signal generator may be implemented, e.g., as a fractional-N phase lock loop (PLL) with a $\Sigma\Delta$ controller, or as a direct-digital synthesis (DDS) PLL. A signal splitter 408 splits the signal from generator 406, sending one copy to a 1:N splitter 410 for distribution to the receivers RX-1 through RX-4 for use in downconversion. The other copy is coupled to a switch S1 that couples the signal to a modulator 412 or a modulator bypass line. The output of modulator 412 is coupled by a second switch S2 to either a 1:N splitter 416 (which distributes the modulated signal to the receivers as a test signal) or to a third switch S3.

Switch S3 selects either the bypass line (carrying the FMCW signal from generator 406) or the modulator output line (carrying a modulated signal from modulator 412) as input for a 1:N splitter 414, which distributes the selected signal to the transmitters TX-1 through TX-4 for transmission. (Note that N represents arbitrary positive integer which may be different value for the transmitters than the receivers.) The transmitters include power amplifiers for driving the associated antennas. Each transmitter may be selectively enabled or disabled, and the enabled transmitters may provide a phase shift to provide the transmit antenna array with beam-forming and/or beam-steering functionality.

The switches S1-S3 may be implemented as standard single-pole double-throw (SPDT) switches, or with split-steer amplifiers and combine-steer amplifiers as disclosed in application No. 62/830,083, titled "Amplifiers suitable for mm-wave signal splitting and combining" and filed 2019 Apr. 5 (ONS03111). The split-steer amplifiers may also be used in place of the splitters to enable graceful degradation and to provide gain.

Modulator 412 provides amplitude and/or phase modulation of the signal from generator 406 to produce a modulated signal. The modulator may be implemented as a quadrature (I/Q) modulator, bi-phase (BPSK) modulator, or an on-off keying (OOK) modulator. It can also be based on a phase shifter with sufficient state-switching speed. The modulated signal can be routed to the receivers as a test signal to verify that the receive chain components are operating correctly or to detect malfunctions. This test signal enables the transceiver to comply with safety standards that require frequent self-testing. In at least some contemplated embodiments, the built-in self-testing (BIST) of the receivers is performed by modulating a fraction of the generated transmit signal using a phase modulator and injecting it to the receiver input. The down-converted signal is then compared to the modulating signal to detect errors in the receive chain.

In the illustrated transceiver embodiment, the phase modulator 412 is used for both BIST and for generation of PMCW signals. The transceiver can operate in three modes: FMCW mode, CW mode, and BIST mode. In FMCW mode, the generator 406 generates an FMCW transmit signal having a chirp waveform. The switches are set to route the FMCW signal to the transmitters via the modulator bypass path, and the receivers use the FMCW signal for downconversion.

In the CW mode, frequency modulation is disabled so that the generator 406 generates an unmodulated carrier signal. The switches are set to route the carrier signal to the modulator and the modulated signal from the modulator to the transmitters. The modulator 412 accepts a digital baseband signal from the controller 404 to specify the phase modulation for the modulated signal. The receivers use the unmodulated carrier signal for downconversion.

In the BIST mode, the controller 404 sets the generator to provide either a carrier or a chirped signal which is routed to the receivers for downconversion. The switches are set to route the signal from the generator to the modulator and from the modulator to the input of the receivers. The illustrated embodiment shows the use of a switch to inject the test signal to the receiver input, but alternative embodiments employ directional couplers, coupling inductors, and/or capacitive or resistive impedance dividers. The modulator 412 accepts a digital baseband signal from the controller 404 to specify the phase modulation for the modulated signal.

The illustrated embodiment thus enables the radar to transmit either FMCW or PMCW signals at a minimum added cost of silicon area and complexity. Potential advantages include: better waveform design flexibility, and reduced sensitivity to interference. Mutual interference between automotive radar sensors is a significant obstacle to full-scale deployment of the technology. However, with the ability to specify new phase-modulated waveform designs, system designers can develop coded signals that provide orthogonality and interference immunity. An external DSP module (such as controller 404) can employ the baseband signal input to modulator 412 to add interference resilience to the illustrated transceiver.

Figure 4B:
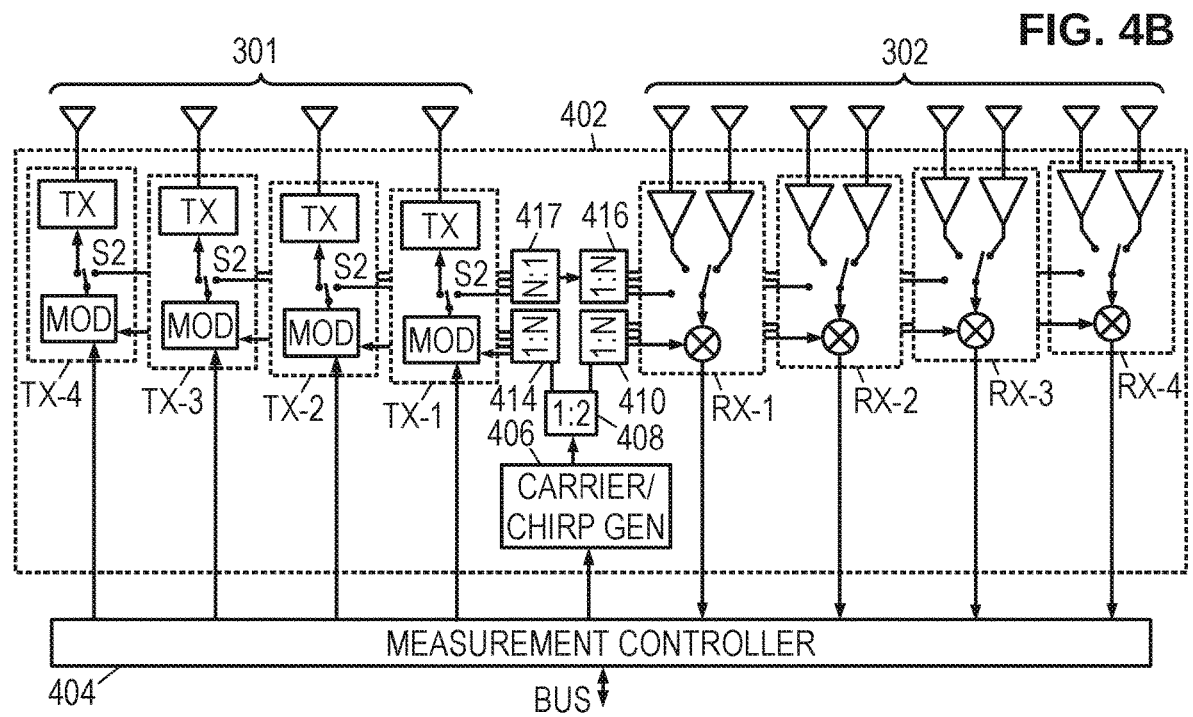
FIG. 4B is a block diagram of an illustrative MIMO radar transceiver with a respective modulator for each transmitter.

The principles set forth above can be extended to a transceiver having separately-modulated transmit signals. FIG. 4B shows an illustrative embodiment in which the carrier/chirp generator 406 provides the carrier signal via the 1:2 splitter 408 to 1:N splitters 410 and 414. Splitter 414 supplies copies of the carrier signal to each of N modulators 412, one for each of the transmitters TX-1 thru TX-4. The modulators may be separately controlled by the measurement controller, enabling simultaneous transmission of multiple signals with different modulations. A switch S2 in each transmitter enables the modulator output to be directed to either the respective transmit antenna or to an N:1 combiner 417. Combiner 417 supplies a combined signal to splitter 416, which operates as described previous to provide a BIST signal to the set of receiver RX-1 thru RX-4.

Figure 5:
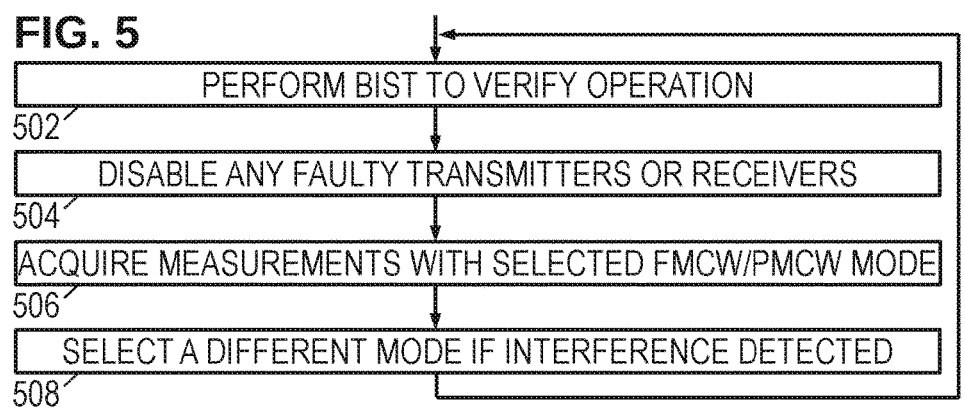
FIG. 5 is a flow diagram of an illustrative radar transceiver operation method.

FIG. 5 is a flow diagram of an illustrative radar transceiver operation method. In block 502, the controller places the transceiver in BIST mode to verify operation of the transceiver components, including testing the receivers by injecting a modulated test signal at the receiver inputs. In block 504, the controller disables any transmitters or receivers that have been determined to be malfunctioning. In block 506, the controller uses the remaining transmitters and receivers to acquire measurements, using either the FMCW or the PMCW measurement mode. The controller processes the downconverted signals to determine distance, direction, and velocity of reflectors in the region of interest. In block 508, the controller determines whether any interference is detected during the measurement acquisition and, if so, switches from the FMCW mode to the PMCW mode or from PMCW mode to FMCW mode for subsequent measurements. If no interference is detected, the current mode is maintained. The controller repeats blocks 502-508 to acquire the subsequent measurements.

Though the operations described herein may be set forth sequentially for explanatory purposes, in practice the method may be carried out by multiple components operating concurrently and perhaps even speculatively to enable out-of-order operations. The sequential discussion is not meant to be limiting. Moreover, the focus of the foregoing discussions has been radar sensors, but the principles are applicable to any pulse-echo or continuous-wave travel time measurement systems. These and numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. A method of operating a radar transceiver, the method comprising:
    generating a transmit signal, the transmit signal being coupled to a mixer in a receiver to down-convert a receive signal;
    modulating the transmit signal using phase modulation to produce a modulated signal;
    injecting the modulated signal into the receive signal during a built-in self-test (BIST);
    verifying operation of the receiver during the built-in self-test; and
    selecting a frequency modulation or phase modulation transmission mode, wherein said selecting includes:
        transmitting the transmit signal, the transmit signal including a chirp waveform;
        processing the down-converted receive signal to determine a distance to a reflector;
            if the down-converted receive signal is indicative of interference, selecting the phase modulation transmission mode; and
            if the down-converted receive signal is not indicative of interference, selecting the frequency modulation transmission mode.

2. The method of claim 1, further comprising: transmitting the transmit signal in the frequency modulation transmission mode, the transmit signal including a chirp waveform.

3. The method of claim 1, further comprising: transmitting the modulated signal in the phase modulation transmission mode.

* * * * *